US005444610A

United States Patent [19]
Gaudreau et al.

[11] Patent Number: 5,444,610
[45] Date of Patent: Aug. 22, 1995

[54] HIGH-POWER MODULATOR

[75] Inventors: Marcel P. J. Gaudreau, Lexington, Mass.; Jean-Paul Dionne, Lapocatiere, Canada

[73] Assignee: Diversified Technologies, Inc., Bedford, Mass.

[21] Appl. No.: 141,485

[22] Filed: Oct. 22, 1993

[51] Int. Cl.⁶ .......................... H02H 7/10; G05F 1/56
[52] U.S. Cl. ........................................ 363/54; 363/51; 323/298; 323/293; 323/352
[58] Field of Search ................ 363/56, 57, 58, 54, 363/52, 51; 323/298, 297, 293, 352, 353, 354

[56] References Cited

U.S. PATENT DOCUMENTS

| | | | |
|---|---|---|---|
| 3,018,433 | 1/1962 | Stone, IV | 323/270 |
| 3,150,310 | 9/1964 | Ault | 323/270 |
| 3,160,807 | 12/1964 | Packard | 323/270 |
| 3,192,467 | 6/1965 | Baracket | 323/270 |
| 3,384,758 | 5/1968 | Kelley | 307/77 |
| 3,458,801 | 7/1969 | Polson | 323/21 |
| 3,500,172 | 3/1970 | Eckstein, Jr. | 323/270 |
| 3,551,788 | 12/1970 | Summer | 323/270 |
| 3,611,031 | 10/1971 | Lutz | 317/11 C |
| 3,761,799 | 9/1973 | Shuey | 323/270 |
| 3,892,977 | 7/1975 | Bierly | 307/77 |
| 3,956,687 | 5/1976 | Lindenman | 323/225 |
| 4,124,886 | 11/1978 | Black et al. | 307/77 |
| 4,334,264 | 6/1982 | Knudsen | 1363/51 |
| 4,400,660 | 8/1983 | Schaefer | 323/270 |
| 4,563,628 | 1/1986 | Tietz et al. | 320/20 |
| 4,594,634 | 6/1986 | Schmike | 361/93 |
| 4,665,458 | 5/1987 | Matsuoka et al. | 361/18 |
| 4,814,966 | 3/1989 | Ekstrand | 363/89 |
| 4,835,668 | 5/1989 | Palm et al. | 363/21 |
| 4,893,070 | 1/1990 | Milberger et al. | 323/270 |
| 4,947,102 | 8/1990 | Ekstrand et al. | 323/293 |
| 4,999,760 | 3/1991 | Tietema | 363/53 |
| 5,155,673 | 10/1993 | Takahashi et al. | 363/54 |

OTHER PUBLICATIONS

Marcel P. J. Gaudreau, "Solid State Circuit Breakers for the Navy", *Small Business Innovation Research Proposal*, U.S. Department of Defense, Appendix B (1992).
Marcel P. J. Gaudreau, "A Long Pulse, High Power Solide-State Gyrotron and Neutral Beam Modular", *Small Business Innovation Research Abstracts of Phase I*

(List continued on next page.)

Primary Examiner—Steven L. Stephan
Assistant Examiner—Robert Nappi
Attorney, Agent, or Firm—Testa, Hurwitz & Thibeault

[57] ABSTRACT

A high-power modulator includes a plurality of means for limiting voltage and a plurality of controllable switches. Each of the switches is connected in parallel with a different one of the voltage limiting means to form a plurality of parallel pairs. Each of the parallel pairs is connected to each other in a series combination. A first parallel pair in the series combination can be connected to a main power source, and a last parallel pair in the series combination can be connected to a load. Each of the switches is switchable from an off or open position to an on or closed position. With the switch in the off position, voltage applied by the main power source which is above a first predetermined voltage results in current provided by the main power source being conducted through the voltage limiting means and a corresponding voltage potential drop across the voltage limiting means being substantially independent of the current conducted therethrough, and voltage applied by the main power source which is below the first predetermined voltage results in current provided by the main power source being substantially prevented from passing through the voltage limiting means. With the switch in the on position, current provided by the main power source is substantially all conducted through the switch and a voltage potential drop across the voltage limiting means is substantially zero. When voltage applied by the main power source is below a second predetermined voltage, a ratio of switches in the on position to those in the off position determines a total voltage potential drop across the series combination and thus the voltage applied to the load.

37 Claims, 9 Drawing Sheets

OTHER PUBLICATIONS

*Awards*, U.S. Department of Energy, p. 39 (1992).

Marcel P. J. Gaudreau, "A Long Pulse, High Power Solid State Gyrotron Modulator–Diversified Technologies, Inc.", *Small Business Innovation Research Abstracts of Phase I Awards*, U.S. Department of Energy, p. 91 (1991).

Marcel P. J. Gaudreau, "A Very High Power Solid State Modulator System for Fusion Systems–Diversified Technologies, Inc.", *Small Business Innovation Research Abstracts of Phase I Awards*, U.S. Department of Energy, pp. 42–43 (1989).

Gaudreau et al., "Detailed Electrical Characterization of the Tara Neutral Beam Injector System", Proceedings of IEEE, 11th Symposium on Fusion Engineering, Austin, Tex., vol. 1, No. 20, p. 187, 1986.

Levy et al., "Commercial Applications for Modulators and Pulse Power Technology", IEEE, Jul. 1992, pp. 8–14, 1992 Twentieth Power Modulator Symposium.

Istvan Nogradi, "Hardfet Modulator", IEEE, Jul. 1992, pp. 189–192, 1992 Twentieth Power Modulator Symposium.

R. Pastore et al. "Preliminary Evaluation of High Power Solid–State Switches for Electric Guns Applications", IEEE, Jul. 1992, pp. 281–284, 1992 Twentieth Power Modulator Symposium.

Bill North and Bill Reass, "Electrical Design and Operation of a Two–Klystron RF Station for the Los Alamos National Laboratory's Neutral Particle Beam Experiment", IEEE, Jul. 1992, pp. 15–18, 1992 Twentieth Power Modulator Symposium.

Paul Robinson and Bill North, "Compact Floating–Deck Modulator for HAX Transmitter", IEEE, Jul. 1992, pp. 41–44, 1992 Twentieth Power Modulator Symposium.

Venkatanarayana et al., "Diagnostic Techniques for On–line Monitoring of High Speed Data in High Voltage Pulsed Power System", IEEE, Jul. 1992, pp. 72–75, 1992 Twentieth Power Modulator Symposium.

Pfeffer et al., "500 Kilowatt Solid–State Modulators for Fermilab's 400 MeV LINAC", IEEE, Jul. 1992, pp. 166–168, 1992 Twentieth Power Modulator Symposium.

Archer Semiconductor Reference Guide, 1987 Edition p. 11, Special Purpose Devices (Varistor).

HIGH-POWER MODULATOR

FIELD OF THE INVENTION

This invention relates to electrical voltage modulators and, more particularly, to solid state, high power, high frequency response-modulators for high voltage loads.

BACKGROUND OF THE INVENTION

There is a broad range of physical and power radio frequency (RF) devices, such as gyrotrons, neutral beam generators and radars, that require high voltage, high-power variable voltage sources with high-frequency response and pulse-switching capabilities. High-power switching and voltage modulation for these applications has typically been accomplished by linear modulators based on high power vacuum electron tubes:

There are many disadvantages to these high-power linear modulators. In the active component of a linear modulator there is high thermal dissipation which dramatically increases when vacuum tubes are employed. The kilovolts of potential drop in the vacuum tubes can produce tens to hundreds of kilowatts of heat and require ancillary support systems the size of a small room.

High power vacuum electron tubes are expensive, fragile and are limited to about 150 A at 150 kV. These tubes require expensive support systems for control, cooling and crowbar protection. The tubes are bulky, sensitive to mechanical shock and magnetic fields, and have a finite life. Also, these devices cannot handle higher voltages envisioned for future gyroton or neutral beam systems due to the intrinsic parasitic oscillation and X-ray problems which presently limits the development of higher power systems.

Solid state devices that are commonly used, such as Insulated Gate Bipolar Transistors (IGBTs) and power Darlingtons, have limited dissipation capability and cannot be employed in high power, high voltage linear modulators.

SUMMARY OF THE INVENTION

Objects of the present invention include the capability to (i) simulate linear modulation by high speed switching of modules in discrete voltage steps at high resolution, and (ii) provide arbitrarily high voltage, such as voltages from about 1 kilovolt (kV) to about 2 megavolt (MV) and currents from about 1 amp (A) to about 10 kiloamps (kA), modulation and regulation to meet future power requirements, and (iii) provide current interruption at arbitrarily high voltage and high current.

An additional object is to provide a modulator capable of meeting a variety of pulsed and continuous high power switching and modulation needs, such as the needs of modulators for medium or high power radar; particle accelerator applications; amplifiers for high speed electromagnetic drives; very low frequency (VLF) or high power sonar; megawatt radio frequency (RF) modulators; high voltage solid state switches; and high voltage switching power supplies.

The present invention, which can include a series combination of parallel-connected switches and voltage limiting means, provides full control of a load's voltage and current, including voltage modulation and regulation, and current interruption. The invention can be embodied in a device which is insensitive to environmental conditions, simple to maintain, smaller, less expensive, more reliable, and that requires less support equipment than known devices. The devices in accordance with the invention can be used for voltages and currents far beyond those of known devices.

Using high power switches (such as IGBTs), high power voltage limiting devices (such as metal-oxide varistors for high voltage power line lightning arresters), and appropriate insulated drive power and control inputs, switching and modulation of extremely high voltages and currents, e.g., up to 2 MV and 10 kA, can be achieved, these ranges being beyond those possible with known devices.

Devices according to the invention can include the combination of switches and voltage limiting means connected in parallel with a load. These devices provide additional independent modulation for any part of the load.

Voltage limiting means in accordance with the invention increase the number of possible applications for modulators according to the invention because the voltage limiting means can have unlimited voltage and current capability.

In one aspect, the invention relates to a high-power modulator which comprises a plurality of means for limiting voltage and a plurality of controllable switches. Each of the switches is connected in parallel with a different one of the voltage limiting means to form a plurality of parallel pairs, and each of the parallel pairs is connected to each other in a series combination. A first parallel pair in the series combination can be connected to a main power source, and a last parallel pair in the series combination can be connected to a load. Each of the switches is switchable from an off or open position to an on or closed position. With the switch in the off position, voltage applied by the main power source which is above a first predetermined voltage results in current provided by the main power source being conducted through the voltage limiting means and a corresponding voltage potential drop across the voltage limiting means being substantially independent of the current conducted therethrough, and voltage applied by the main power source which is below the first predetermined voltage results in current provided by the main power source being substantially prevented from passing through the voltage limiting means. With the switch in the on position, current provided by the main power source is substantially all conducted through the switch and a voltage potential drop across the voltage limiting means is substantially zero. Thus, when voltage applied by the main power source is below a second predetermined voltage, a ratio of switches in the on position to those in the off position determines a total voltage potential drop across the series combination and thus the voltage applied to the load.

In another aspect, the invention relates to a high-power modulator which comprises a plurality of first means for limiting voltage connected to each other in series where this series connection can be connected in parallel to a load. At least one first controllable switch is connected in parallel with at least one of the first voltage limiting means. A plurality of second means for limiting voltage is connected to each other in series where this series connection is coupled at one end to the first voltage limiting means and can be coupled at the other end to a main power source. At least one second controllable switch is connected in parallel with at least one of the second voltage limiting means. Each of the first and second switches is switchable from an off or open position to an on or closed position. With the switch in the off position, current provided by the main power source is conducted through the voltage limiting means and a corresponding voltage potential drop across the voltage limiting means is substantially independent of the current conducted therethrough. With the switch in the on position, current provided by the main power source is substantially all conducted through the switch and a voltage potential drop across the voltage limiting means is substantially zero. Thus, when voltage is applied by the main power source, a ratio of switches in the on position to those in the off position determines a total voltage potential drop across the series connection of the first voltage limiting means and thus the voltage applied to the load.

In still another aspect, the invention features a voltage limiting means which comprises a parallel network including a dissipating resistor, a switch connected in series with the dissipating resistor, and a capacitor connected in parallel with the series connection of the dissipating resistor and the switch. A means for discharge protection is connected in series with the parallel network. A ratio of the on and off states of the switch determines a blocking voltage of the voltage limiting means. Above the blocking voltage, current provided by a power source is conducted through the voltage limiting means and a corresponding voltage potential drop across the voltage limiting means is substantially independent of the current conducted therethrough. Below the blocking voltage, current provided by the power source is substantially prevented from passing through the voltage limiting means.

In yet another aspect, the invention relates to an apparatus for providing power to a gate drive of a solid state power switch. This apparatus comprises a solid state power switch; a first DC-to-DC converter connected in parallel to the power switch, the first converter for converting a high open switch voltage to a first control voltage; and a series combination connected in parallel with the power switch. The series combination includes a second DC-to-DC converter for converting the solid state power switch low saturation voltage to a second control voltage, and a high-voltage solid-state switch.

These and other objects, aspects, features, and advantages of the invention will become apparent from the following description and from the claims.

DETAILED DESCRIPTION

Figure 1A:
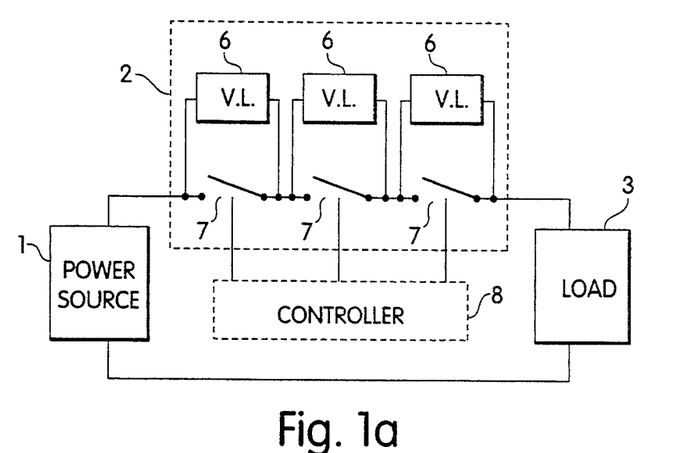
FIGS. 1a, 1b, 1c are block diagrams of three embodiments of a modulator according to the invention.

Referring to FIG. 1a, a modulator 2 according to the invention is shown connected between a power source 1 and load 3. The modulator 2 contains a plurality of series connected voltage limiting means 6, connected in series with a load 3, and a plurality of electrically controlled switches 7, connected in parallel with each voltage limiting means 6, and a control means 8, connected to control inputs of switches 7.

For the voltage limiting means 6, above a specified blocking voltage, significant current is conducted through the means 6 with a potential drop independent or slightly dependent of the current passing through. Below this specified blocking voltage, no significant current is conducted through the means 6. With switch 7, connected in parallel with voltage limiting means 6, closed a potential drop across a voltage limiting means is substantially zero.

Figure 2:
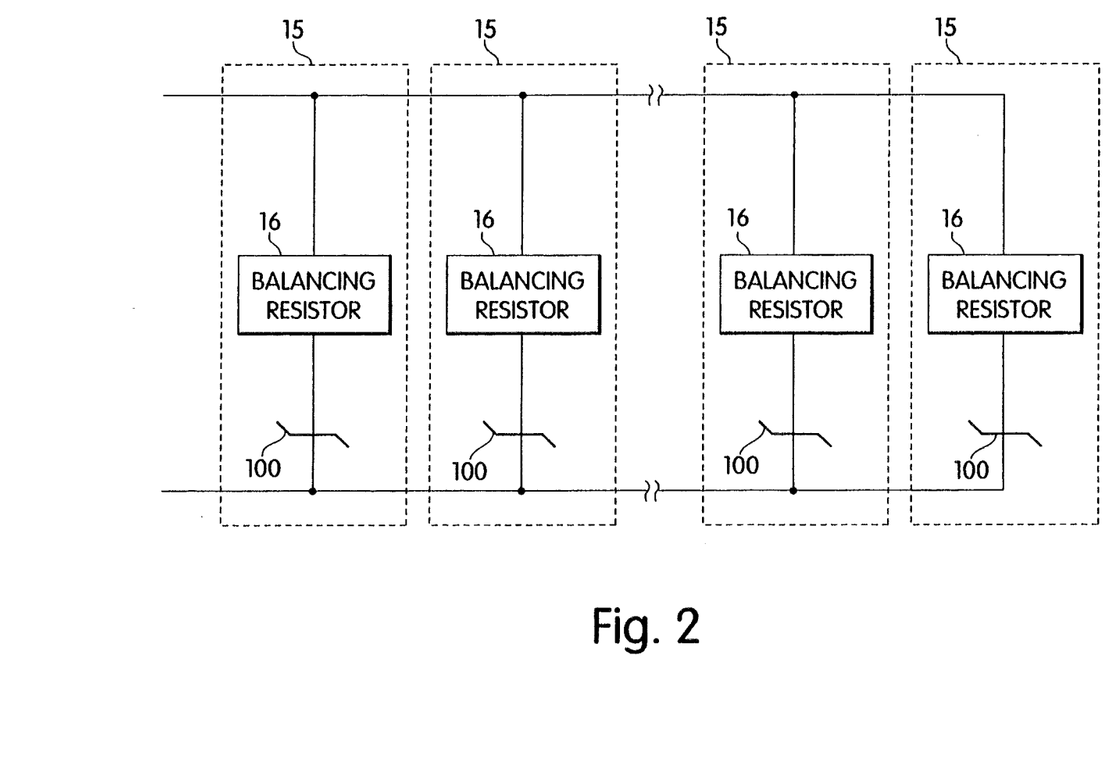
FIG. 2 is a schematic of a voltage limiting device using Metal-Oxide Varistors.
Figure 3:
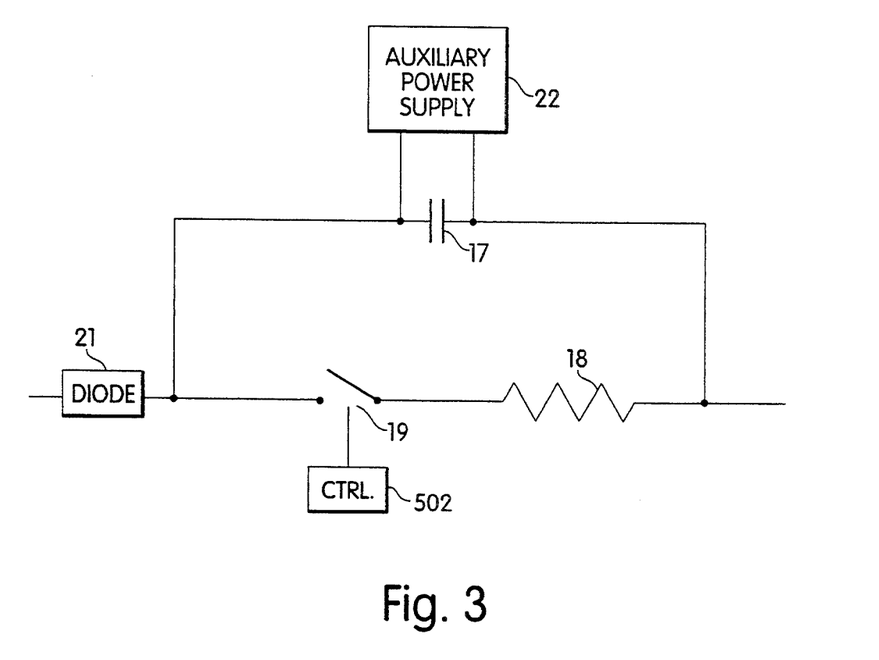
FIG. 3 is a schematic of a voltage limiting device using an active resistor.
Figure 4:
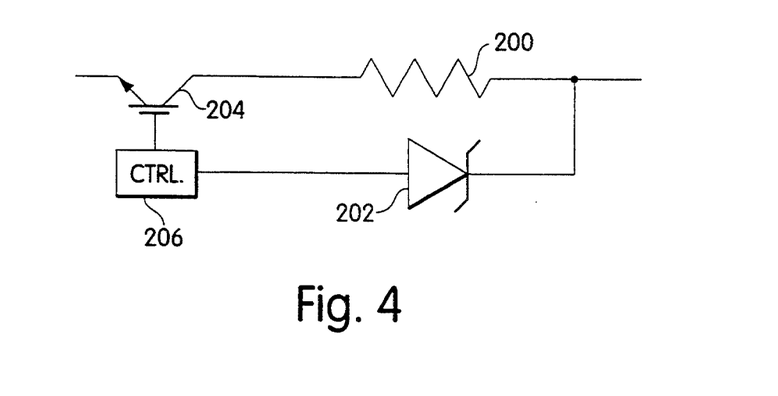
FIG. 4 is a schematic of a voltage limiting device using a Zener dissipator.

Three different embodiments for the voltage limiting means are presented in FIGS. 2, 3 and 4.

There are two different modes of operation of the modulator.

In the first mode voltage of power source 1 applied to the modulator 2 is below the total blocking voltage of voltage limiting means 6. In this mode with all switches 7 open, full voltage of power source 1 will be applied to the modulator 2 and no significant current will be conducted through the load 3. With all switches closed, current will pass through the modulator with a fairy low voltage drop, and full voltage will be applied to the load. This mode represents a current interruption function of the modulator. For providing "soft" current interruption switches 7 are switched from the open to close state one by one, hence voltage limiting means are shorted one by one with switches 7; total blocking voltage of the modulator decreases stepwise, and voltage applied to the load increases respectively. In the end of the conduction phase, the switches are switched from close to open state one by one, total blocking voltage of the modulator increases stepwise, and voltage applied to the load decreases from full voltage to zero.

In the second mode, voltage of power source 1 applied to the modulator 2 is above the total blocking voltage of voltage limiting means 6. In this mode a ratio of switches 7 being in close and open states determines the total potential drop of the modulator and hence, determines the voltage applied to the load, thereby providing voltage modulation or regulation in discrete steps. By appropriate order of switching voltage limiting means with different blocking voltages, very high resolution of modulation or regulation can be achieved.

Figure 1B:
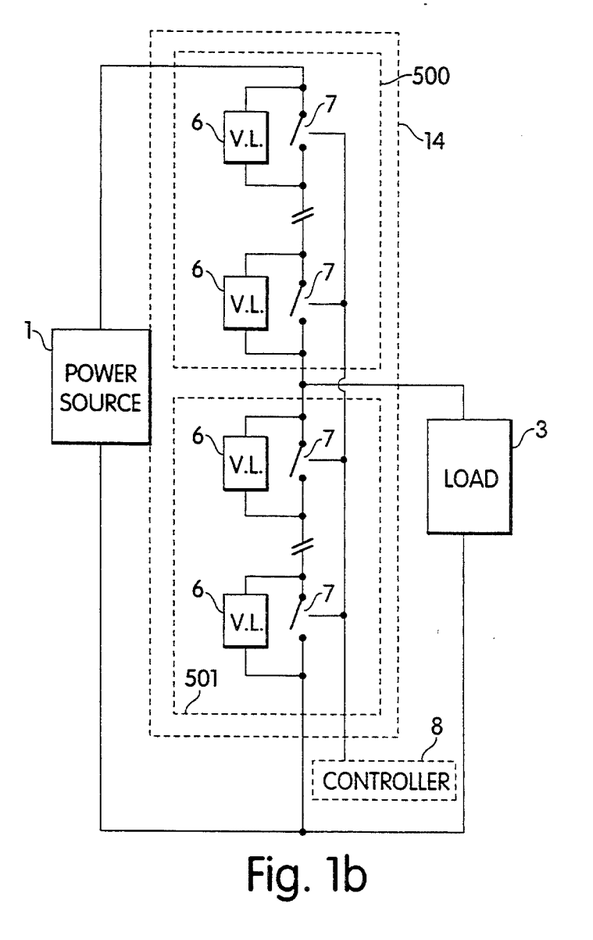

Referring to FIG. 1b, a modulator 14 according to the invention is shown connected to a power source 1. The modulator 14 contains two series connected networks 500 and 501 of series connected voltage limiting means 6 and electrically controlled switches 7, connected in parallel with some of voltage limiting means 6. While each voltage limiting means 6 is shown having a switch 7 it is possible that some voltage limiting means 6 do not have a switch 7 associated therewith. Also, if network 501 includes one or more means 6 and/or switches 7, network 500 is not needed. Load 3 is connected in parallel with one of these networks. Control means 8 is connected to control inputs of switches 7. Similar to the modulator of FIG. 1a, a ratio of switches 7 in close and open states determines the total potential drop of modulator and hence, determines the voltage applied to the load, thereby providing voltage modulation or regulation in discrete steps. By appropriate order of switching voltage limiting means with different blocking voltages, very high resolution of modulation or regulation can be achieved. This configuration has the advantage that the voltage on the load can be forced ON by one network and forced OFF by the other network.

Figure 1C:
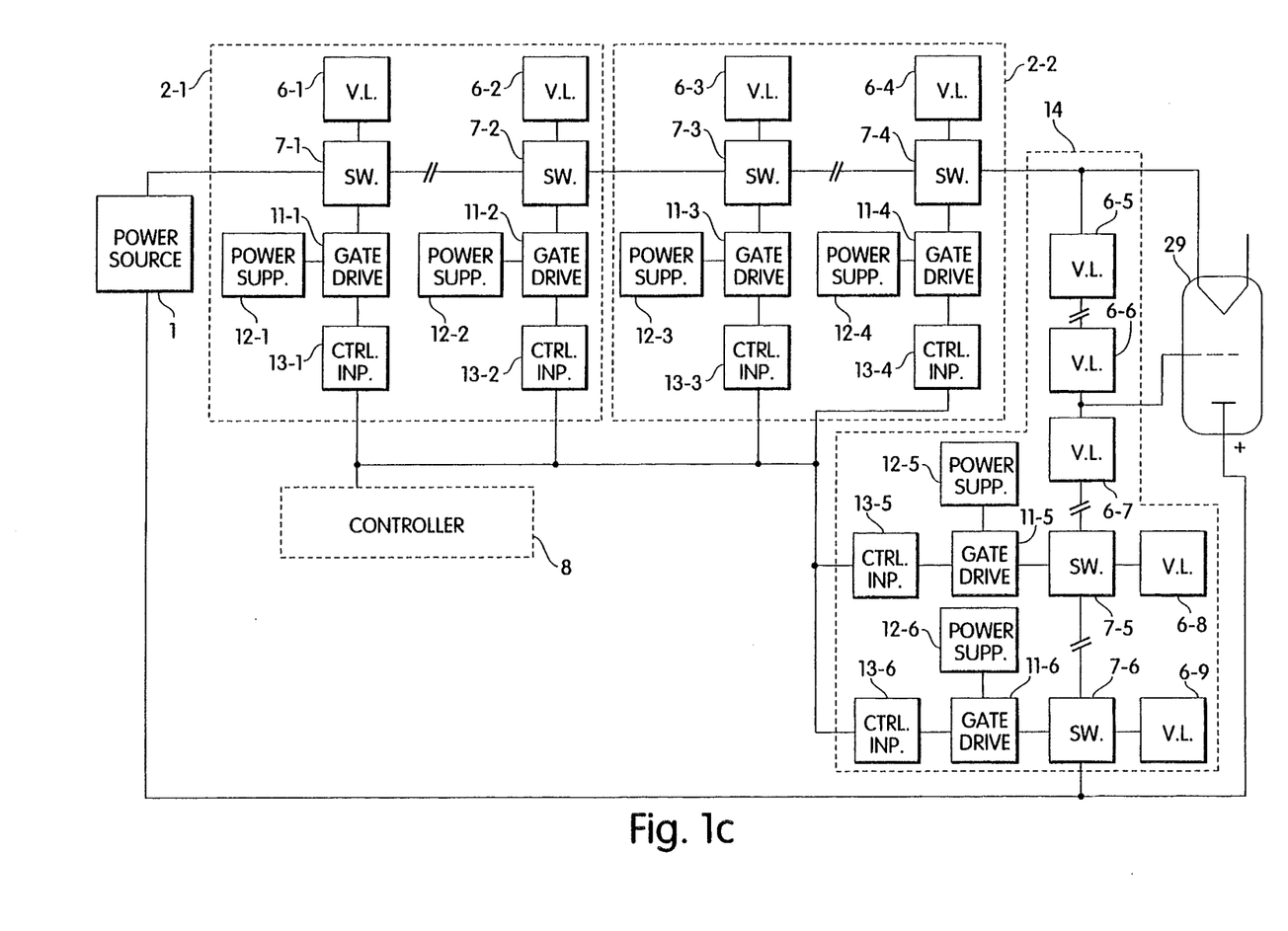

Referring to FIG. 1c, in one embodiment, three modulators are shown with a gyrotron load. Modulators 2-1 and 2-2 comprising voltage limiting means 6-1 through 6-4 and parallel connected switches 7-1 through 7-4 are shown connected between power source 1 and gyrotron 29. Other loads are possible as mentioned elsewhere. Modulator 14 comprising voltage limiting means 6-5 through 6-9 and parallel connected switches 7-5, 7-6 is shown connected in parallel to the gyrotron 29 and the gyrotron's grid is connected in parallel with the first network of the series connected voltage limiting means 6-7 through 6-9. Switches 7-1 through 7-6 are switched ON and OFF by control means 8 through control inputs 13-1 through 13-6 gate drives 11-1 through 11-6 with power supplies 12-1 through 12-6.

Modulator 2-1 has a total blocking voltage higher than the voltage of power source 1 and performs the function of an enable switch, providing current interruption. Modulator 2-2 has a total blocking voltage lower than the voltage of the power source and performs the function of voltage modulation and regulation. Modulator 14 performs the function of active voltage divider, supplying bias voltage for the gyrotron's grid.

Referring to FIG. 2, in one embodiment the voltage limiting means 6 includes one or more parallel groups of metal-oxide varistors MOV(s) 15. Each parallel group contains one or more MOVs connected in series. When the number of parallel groups is more than one, each group contains a balancing resistor 16 connected in series with the MOVs 100. The number of MOVs in every group is chosen so that the total blocking voltage of all the MOVs connected in series is equal to the desired blocking voltage of the voltage limiting means 6. The number of parallel groups is chosen so that the total maximum current of all groups connected in parallel is equal to or more than the maximum load current.

When the voltage is higher than the blocking voltage applied to the voltage limiting means, all MOVs 100 conduct current. The total current passing through the MOVs is equal to the load's current; the total potential drop is independent or slightly dependent on passing current and is equal to the total blocking voltage of all MOVs connected in series. The potential drop in the balancing resistors 16 depends on the current flowing in each parallel group and compensates differences in the blocking voltage of the MOVs so that the current flowing through each parallel group is approximately the same.

In this embodiment, the resistor is only one of many possible realizations of balancing devices.

Referring to FIG. 3, in another embodiment, the voltage limiting means 6 includes a capacitor 17 connected in parallel with a series combination of a dissipating resistor 18 and switch 19. A diode 21 is connected in series with the parallel network of the capacitor 17, the resistor 18, and switch 19. The polarity of the diode connection depends on the polarity of the load current. An auxiliary power supply 22 is connected in parallel with capacitor 17. The polarity of the power supply connection depends on the polarity of the load current.

When the switch 19 is open, the capacitor 17 is charged at a rate defined by the load current and the switch-off time. Similarly, when the switch 19 is closed, the capacitor 17 is discharged through the resistor 18. Control means 502 maintains voltage across the capacitor 17 and is controlled by the open/close time of the switch 19. Thus, this voltage is independent of the current, passing through the voltage limiting means. By varying a reference voltage of the control means 502, variable voltage across the capacitor can be obtained. The diode 21 prevents the capacitor 17 from discharging when switch 7 (FIG. 1) is closed.

In this embodiment, the diode is only one of many possible realizations of discharging protecting devices. The auxiliary power supply 22 is not always necessary; it precharges the capacitor 17 in the beginning of the working cycle to make the capacitor's charging time independent of the load current.

Referring to FIG. 4, in another embodiment of the voltage limiting means 6, a Zener dissipator includes a dissipating resistor 200 a voltage reference device 202, and a regulating device 204. The dissipating resistor 200 and the regulating device 204 are connected in series. The voltage reference device 202 is connected to the input of the regulating device.

The voltage across the voltage reference device 202 is measured by the control means 206 and the voltage across the regulating device 204 is changed so that the voltage across the resistor 200 and the regulating device 204 is always proportional to the reference voltage, regardless of the current flowing.

In this embodiment, the dissipating resistor is not always necessary, it is used only for improved efficiency. As a regulating device a bipolar transistor, an insulated gate bipolar transistor (IGBT), or a metal-oxide semiconductor field effect transistor (MOSFET) can be used. As a voltage reference device, a Zener diode or metal-oxide varistor (MOV) can be used Referring to FIG. 5, according to the invention, one embodiment of a modulator can be used for gyrotron control. In this embodiment, an enable switch 27-1 and a ladder of dissipator modules 28, connected in series, are connected between a high voltage power source 26 and a load 29 (in this case, the gyrotron). A surge suppresser 30, which includes a stack of MOVs 31, is connected in parallel to the power source 26.

Figure 5:
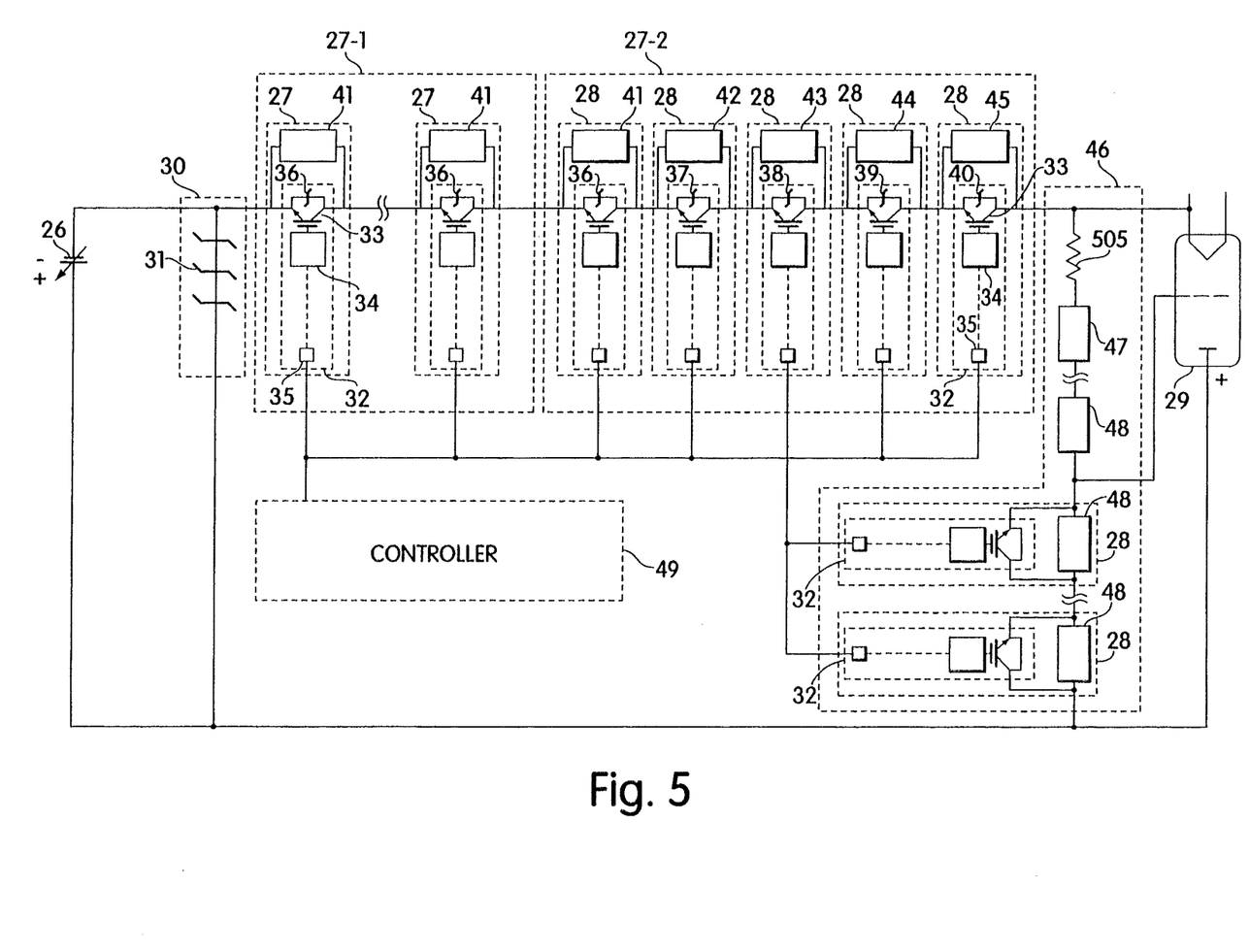
FIG. 5 is a schematic of the modulator applied to a gyrotron load.

The enable switch 27-1 includes a ladder of switch modules 32.

The switch modules 32 are based on an IGBT switch 33. The gate of the IGBT 33 is connected to a control means 49 through an insulated control input 35 and a gate drive 34 with embedded insulated power supply. The surge suppressor MOVs 31 are connected in parallel with the switch modules 32.

The dissipater modules 28 include switch modules 32 connected in parallel with the MOVs 36, 37, 38, 39 or 40, which perform the functions of both the voltage limiting means and a snubber. An MOV in each dissipater module has a decreasing binary fraction of the unit blocking voltage. The first module has a unit blocking voltage MOV 36 which is in parallel with the switch 33. The second module has a one-half blocking voltage MOV 37. The third module has a one-quarter blocking voltage MOV 38. The fourth module has a one-eighth blocking voltage MOV 39. The fifth module has a one-sixteenth blocking voltage MOV 40.

Heat dissipation means 41–45 are connected in parallel with the switch modules 32. The heat dissipation means 41 has a unit blocking voltage, and 42, 43, 44 and 45 have one-half, one-quarter, one-eighth and one-sixteenth blocking voltage respectively. The heat dissipation means can have a structure similar to that shown in FIG. 2, with the exception that a fuse is also placed in series with each parallel group of MOVs.

A variable active voltage divider 46 is connected to the modulator's output in parallel to the load. The active divider consists of MOVs 47, 48 with different blocking voltage, connected in series. The switch modules 32 are connected in parallel with some MOVs 48. The tap of the voltage divider is connected to the gyrotron's grid. A resistor 505 can be implemented to reduce power dissipated by means 46.

Referring to FIG. 5, the operation of the modulator for gyrotron control is as follows: The power source 26 applies high voltage to the modulator. For a gyrotron the polarity of the supply is negative.

The surge suppressor 30 prevents voltage spikes higher than the blocking voltage of the enable switch 27 from being applied to the modulator.

IGBT switches 32 in enable switch 27-1 are switched ON and OFF by control means 49 through control inputs 35 and gate drives 34. When enable switch 27-1 is OFF, full voltage of the power source 26 is applied to the switch, preventing current from passing through gyrotron 29. When the enable switch is ON, current passes through the enable switch with a fairly low voltage drop, and full voltage of the power source is applied to the dissipator modules 28 and the gyrotron 29.

Dissipater modules 28, unlike enable switch 27, must often carry high current even when switched off, yet still maintain their full blocking voltage. The power that must be dissipated in this case is too high for the heat sinking capabilities of MOVs 36 through 40. Dissipater modules 41 through 45 are placed in parallel with each switch module. Each dissipater module has a structure shown in FIG. 2, with one exception: a fuse is also placed in series with each parallel group of MOVs to prevent one faulty MOV from shorting out the whole stack. Any number of MOVs can be placed in parallel in this manner, allowing arbitrarily high power dissipaters.

If voltage higher than the blocking voltage is applied to dissipater module 28 with switch 32 open, current is conducted by heat dissipation means 41 through 45 and the power of the blocking voltage is dissipated by the heat dissipation means. With the switch 32 closed, current is conducted by switch with very small voltage drop across the switch.

Control means 49 determines the order of switching ON and OFF the switches 32 in dissipater modules 28, providing voltage modulation in discrete, relatively small steps. This embodiment shows, a group of five dissipater modules of unit 41, one-half 42, one-quarter 43, one-eighth 44, and one-sixteenth 45 blocking voltages that could be controlled in a binary fashion. For example, 1000 V, 500 V, 250 V, 125 V and 62.5 V dissipater modules could control voltages from 0 V to 2 kV in 62.5 V steps. By controlling which modules are switched, linear voltage modulation can be simulated by discrete steps.

The order of switching switch modules 32 in active divider 46 is determined by control means 49 so that the voltage of the active divider's tap is equal the required voltage of the load's tap.

Figure 6:
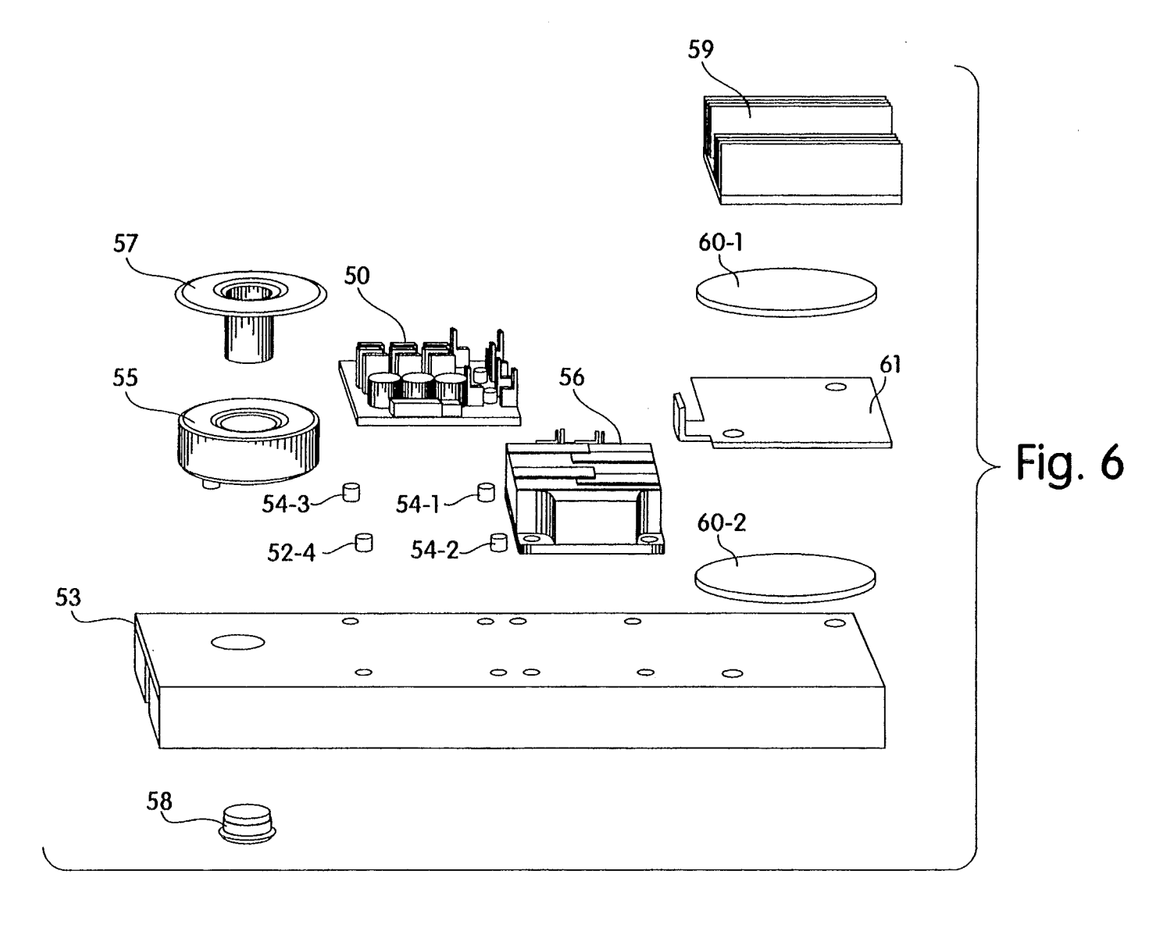
FIG. 6 is an exploded view of a dual switch module.

Referring to FIG. 6, according to the invention, a dual switch module includes a dual gate drive 50 bolted to a main switch module heat sink 53 with standoffs 54-1 to 54-4 between the two. In this embodiment, dual gate drive 50 receives power from the secondary winding of an isolation transformer 55. The isolation transformer 55 is attached to the main switch module heat sink 53. The isolation transformer has an upper corona shield 57 and a lower corona shield 58. The dual gate drive 50 outputs to the gates of a dual IGBT 56. The free collector of dual IGBT 56 is connected to an upper switch module heat sink 59. The upper switch module heat sink 59 rests on the MOV 60-1. This MOV in turn rests on an MOV separator/heat sink 61. The MOV separator/heat sink 61 is attached to the common emitter/collector of the dual IGBT 56. The MOV separator/heat sink 61 rests on another MOV 60-2, which rests on the main switch module heat sink 53. The main switch module heat sink 53 is connected to the free emitter of dual IGBT 56. The entire MOV/heat sink assembly is bolted together using insulating bolts.

Figure 7:
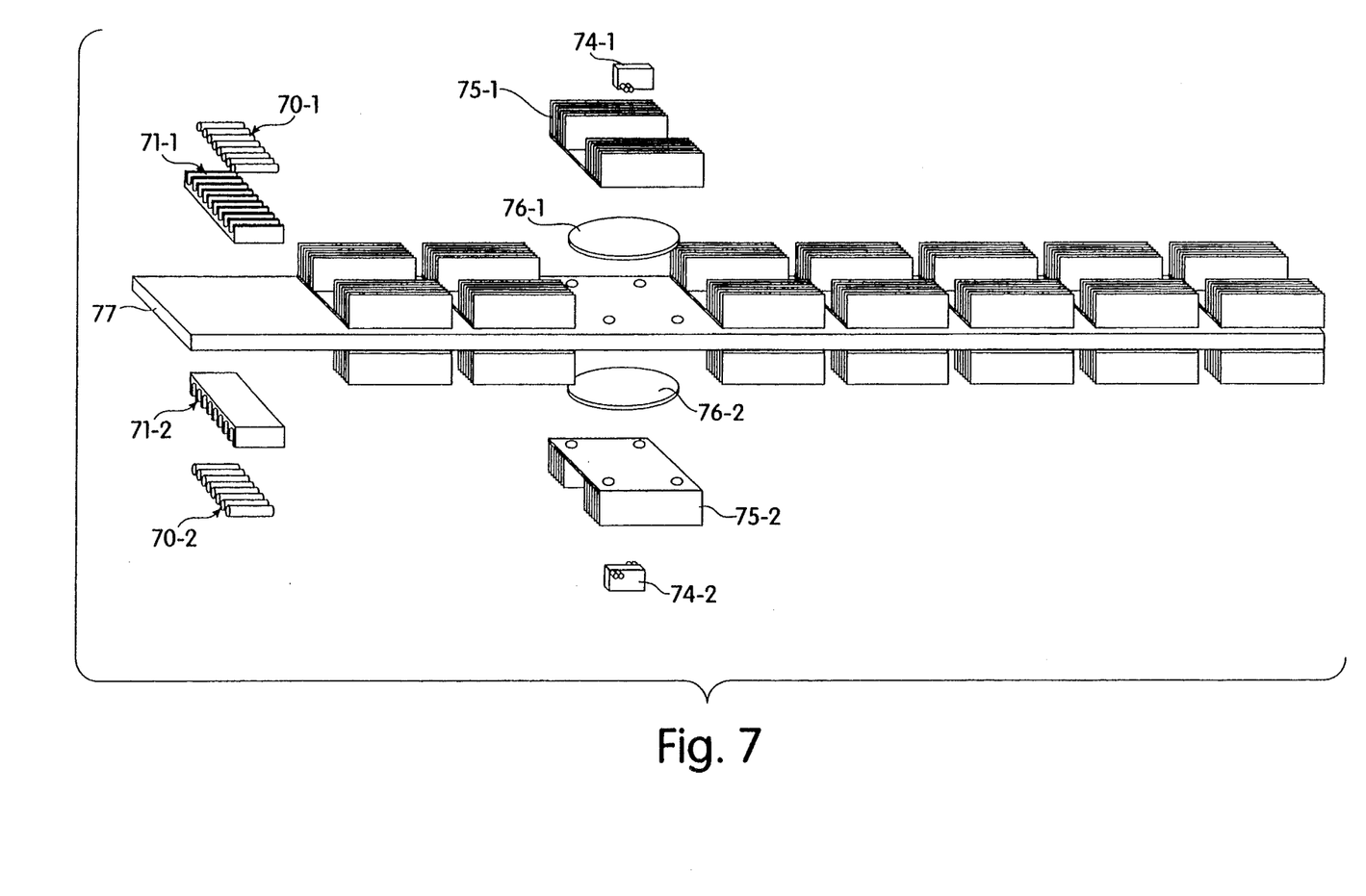
FIG. 7 is an exploded view of a dual dissipater module.

Referring to FIG. 7, according to the invention in a dual dissipater module fuses 70-1 are placed in fuse holders 71-1. In the upper dissipater module, each fuse 70-1 is connected to the free collector of the dual IGBT 56, FIG. 6. In the lower dissipater module, each fuse 70-1 is connected to the free emitter of the dual IGBT 56. Each fuse 70-1 is then connected in series to an individual balancing resistor 74-1. The balancing resistor 74-1 is connected in series to a dissipater MOV heat sink 77. The dissipater MOV heat sink 77 is connected in series with MOV 76-1. The MOV 76-1 is connected to a dissipater mounting bar/heat sink 77. Dissipater mounting bar/heat sink 77 is connected to the common collector/emitter of the dual IGBT 56. The heat sink/MOV assemblies are bolted to dissipater mounting bar/heat sink 77 using insulating material.

The specific embodiments for mounting and heat sinking as well as the physical location and attachment of heat sinks and other module components are unimportant to the nature of the invention.

The IGBTs shown in this embodiment of the modulator are only one type of semiconductor switch that could be used as a basis for the switch modules. Other possible choices for semiconductor switches include Metal Oxide Semiconductor Field Effect Transistor Controlled Thyristors (MCTs), Gate Turn Off thyristors (GTO) and Power Darlingtons.

The number of binary fraction or unit blocking voltage modules represented is only one embodiment; many other arrangements are possible. Any number of switch modules can be placed in series in the enable switch to arbitrarily high blocking voltages, with proper isolation. Similarly, any number of switch modules in the main modulator can be placed in series, each with any arbitrary blocking voltage. Any linear, binary, or both linear and binary arrangements of blocking voltages are possible, with an appropriate control means. Very high resolutions are possible, depending on how many dissipator modules are used. The number of parallel MOVs in a dissipator module depends only on the maximum current required and pulse lenth, and any number is possible.

Figure 8:
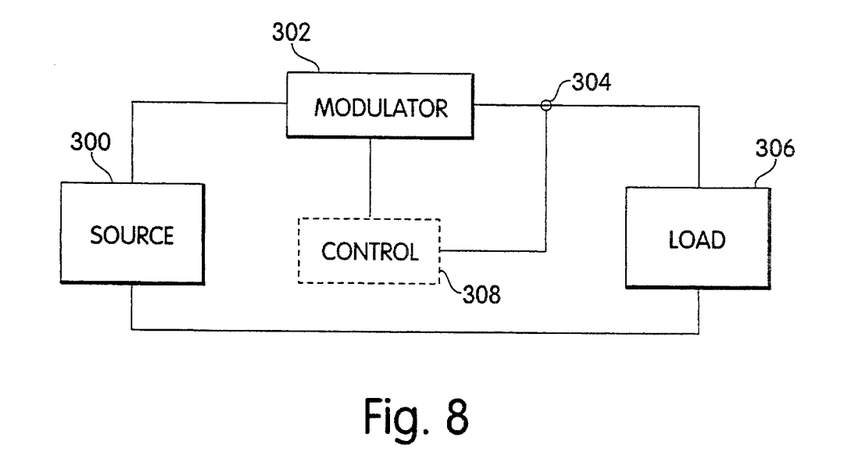
FIG. 8 is a block diagram of a modulator in an overcurrent protection device (circuit breaker) application.
Figure 9:
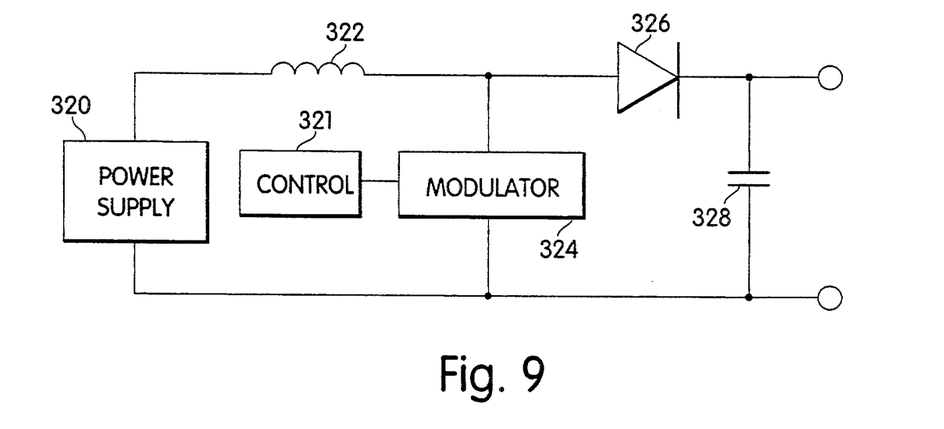
FIG. 9 is a block diagram of a modulator in a boost converter application.
Figure 10:
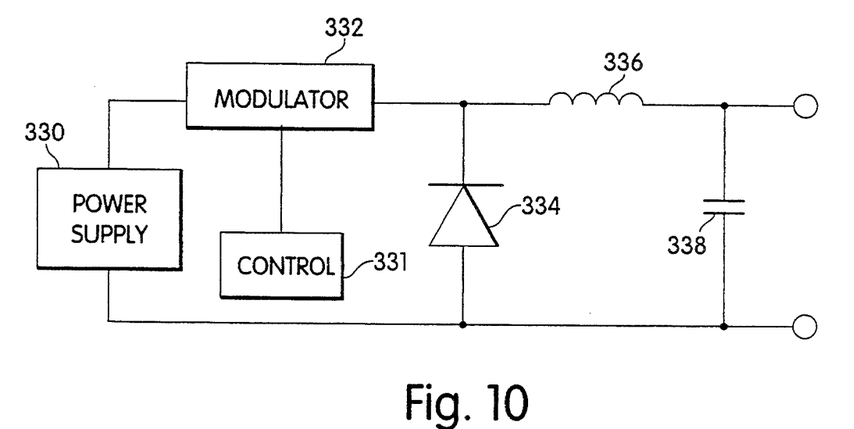
FIG. 10 is a block diagram of a modulator in a buck converter application.

The modulator also can be used as a commutation element in various switching applications. Use of the modulator with conventional structures allows the conventional structure to operate at much higher voltage (1 kV to 2 MV). Three examples of such usage are shown in FIGS. 8, 9 and 10. FIG. 8 presents the modulator 302 in an overcurrent protection device (e.g., a circuit breaker). The modulator 302 is connected in series between the source 300 and the load 306. A control means 308 turns OFF the modulator when an overcurrent is detected by the current sensor 304 or when the power supply need to be disconnected from the load. The control means 308 turns ON the modulator when the power supply needs to be connected to the load.

FIG. 9 presents the modulator 324 in a boost converter configuration. The control mean 321 turns ON and OFF the modulator 324. When the modulator is ON, the power supply 320 forces current in the inductance 322, and when the modulator is OFF the inductance charges the capacitor 328 through the diode 326.

FIG. 10 presents a buck converter. The modulator 332 controls the energy transfer to the inductance 336 and capacitor 338 network from the power supply 330. The diode 334 creates a path for the inductance 336 current when the modulator 332 is off. The control means 331 determines the modulator's turn ON and OFF time.

Figure 11:
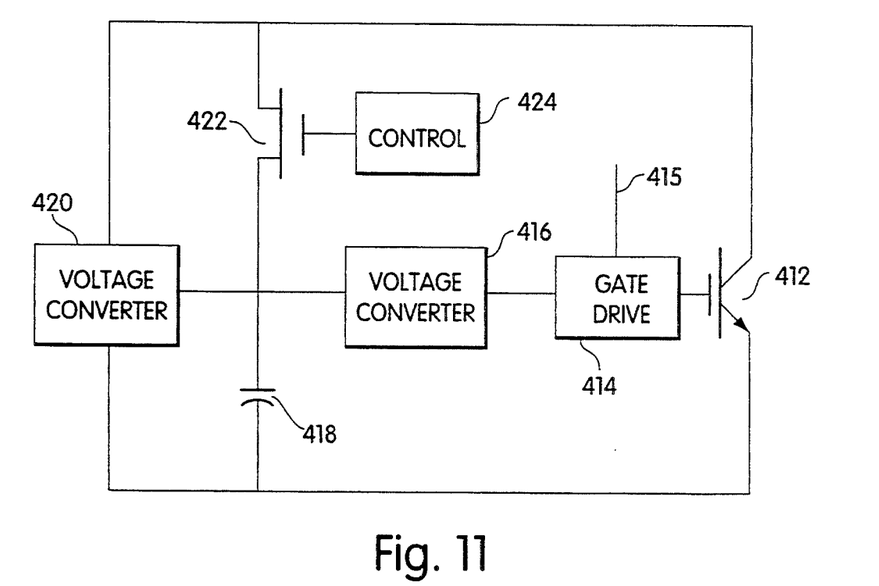
FIG. 11 is a block diagram of an apparatus for providing power to a gate drive of a solid state power switch.

Referring to FIG. 11, according to the invention, an apparatus for providing power to a gate drive of a solid state power switch consists of a high voltage to low voltage converter 420, for example 1000 V to 3 V, connected in parallel with a solid state switch 412. Its low voltage output is connected to the low voltage input of the second converter 416. The outputs of the second converter 416 supply power for the gate drive 414 connected to the control input of the solid state switch 412, and for the control means 424, connected to the control input of high voltage low current switch 422. Low voltage input of the second converter 416 is also connected in parallel with solid state switch 412 through high voltage switch 422. Storage capacitor 418 is connected in parallel with the low voltage input of second converter 416. Optical link 415 provides the control signal to gate drive 414.

When solid state switch 412 is open, high voltage across the switch is convened by first converter 420 to a low voltage. Second converter 416 converts this voltage to the control voltage, which is necessary for the gate drive 414. High voltage switch 422 is disabled by control means 424, protecting second converter 416 from the high voltage.

When power switch 412 is closed, voltage across it is about 2 to 3 volts, and this voltage is insufficient for normal operation of first converter 420. High voltage switch 422 is enabled by control means 424 and second converter 416 receives power through closed switch 422, supplying control voltage to the gate drive 414. Thus, gate drive 414 receives power continously, independent of the state of power switch 412.

The above description makes it clear that according to the invention a modulator can perform switching and linear modulation functions at high speed while requiring minimal support equipment and protection circuitry, being small and easy to maintain, relatively inexpensive and environmentally insensitive. The modulator can be used for voltages and currents far beyond those of known modulators.

The modulator can be air, gas, epoxy, or oil insulated depending on the application.

While this description is often specific, the specifics should not be viewed as limitations on the scope of the invention. The above description should only be regarded as an exemplification of embodiments of the invention. Many other variations am still possible. For example, the many potential uses and variations of the invention might include modulators for medium or high power radar and particle accelerator applications; amplifiers for high speed electromagnetic drives, very low frequency (VLF) or high power sonar; and megawatt RF modulators. Accordingly, my invention's scope should be determined by the appended claims and their legal equivalents, not by the specific embodiments described above.

What is claimed is:

1. A high-power modulator, comprising:
   a plurality of means for limiting voltage; and
   a plurality of controllable switches, each of the switches connected in parallel with a different one of the voltage limiting means to form a plurality of parallel pairs, each of the parallel pairs connected to each other in a series combination with a first parallel pair in the series combination being connectable to a main power source and a last parallel pair in the series combination being connectable to a load;
   each of the switches being switchable from an off or open position to an on or closed position such that, for each of the parallel pairs:
      with the switch in the off position,
         when voltage applied to the voltage limiting means is above a first predetermined voltage, current is allowed to conduct through the voltage limiting means and a voltage potential drop across the voltage limiting means is substantially independent of the current conducted therethrough, and
         when voltage applied to the voltage limiting means is below the first predetermined voltage, current is substantially prevented from passing through the voltage limiting means; and
      with the switch in the on position, current is substantially all conducted through the switch and the voltage potential drop across the voltage limiting means is substantially zero;
   the series combination having a voltage potential drop thereacross which is varied by operation of the controllable switches wherein:
      a ratio of switches in the on position to those in the off position determines the voltage potential drop across the series combination and thus the voltage applied to the load by the main power source,
      with each of the switches in the on position, the voltage potential drop across the series combination is substantially zero and substantially all of the voltage of the main Dower source is applied to the load, and
      with each of the switches in the off position, the voltage potential drop across the series combination is greater than the voltage applied by the main power source and substantially no current is conducted to the load.

2. A high-power modulator, comprising:
   a plurality of first means for limiting voltage connected to each other in series, the series connection of the plurality of first voltage limiting means being connectable in parallel to a load;

a plurality of second means for limiting voltage connected to each other in series, the series connection of the plurality of second voltage limiting means being connected in series between a main power source and the parallel connection of the plurality of first voltage limiting means and the load when the plurality of first voltage limiting means are connected in parallel to the load and when the main power source is coupled to the plurality of second voltage limiting means;

at least one controllable switch connected in parallel with at least one of the first or second voltage limiting means;

each of the switches being switchable from an off or open position to an on or closed position such that, for each of the parallel-connected switch and first or second voltage limiting means:

with the switch in the off position, current is allowed to conduct through the voltage limiting means and a voltage potential drop across the voltage limiting means is substantially independent of the current conducted therethrough, and with the switch in the on position, current is substantially all conducted through the switch and the voltage potential drop across the voltage limiting means is substantially zero;

whereby, when voltage is applied by the main power source, a ratio of switches in the on position to those in the off position determines the voltage applied to the load.

3. The modulator of claim 1 wherein at least one of the plurality of voltage limiting means comprises at least one metal-oxide varistor.

4. The modulator of claim 1 wherein at least one of the plurality of voltage limiting means comprises a plurality of series networks connected in parallel, each of the series networks including at least one metal-oxide varistor connected in series to at least one balancing means.

5. The modulator of claim 1 wherein at least one of the plurality of voltage limiting means comprises:
a parallel network including
a dissipating resistor,
a switch connected in series with the dissipating resistor, and
a capacitor connected in parallel with the series connection of the dissipating resistor and the switch; and
means for discharge protection connected in series with the parallel network.

6. The modulator of claim 5 wherein the discharge protection means comprises a diode.

7. The modulator of claim 2 wherein at least one of the plurality of first voltage limiting means comprises:
a parallel network including
a dissipating resistor,
a switch connected in series with the dissipating resistor, and
a capacitor connected in parallel with the series connection of the dissipating resistor and the switch; and
means for discharge protection connected in series with the parallel network.

8. The modulator of claim 7 wherein the discharge protection means comprises a diode.

9. The modulator of claim 1 wherein at least one of the plurality of voltage limiting means comprises regulation means, and voltage reference means connected to the regulation means to maintain the voltage across the regulation means substantially constant and proportional to a reference voltage regardless of current flowing through the regulation means and the voltage reference means.

10. The modulator of claim 9 wherein the regulation means comprises a transistor.

11. The modulator of claim 2 wherein at least one of the plurality of first voltage limiting means comprises:
regulation means; and
voltage reference means connected in series to the regulation means to maintain the voltage across the regulation means substantially constant and proportional to a reference voltage regardless of current flowing through the series combination of the regulation means and the voltage reference means.

12. The modulator of claim 11 wherein the regulation means comprises a transistor.

13. The modulator of claim 2 further comprising at least one resistor connected in series with the plurality of first voltage limiting means.

14. The modulator of claim 2 further comprising at least one resistor connected in series with the plurality of second voltage limiting means.

15. The modulator of claim 1 further comprising:
means, coupled to each of the switches, for controlling and independently switching the switches such that
in the beginning of a voltage pulse from the main power source, voltage applied to the load increases stepwise, and
in the end of the voltage pulse from the main power source, voltage applied to the load decreases stepwise.

16. The modulator of claim 1 wherein the controllable switch comprises:
a power switching device;
a drive coupled to the power switching device for driving the power switching device;
a drive power supply coupled to the drive for providing voltage and current to the drive; and
a control input coupled to the drive for receiving input from a controller.

17. The modulator of claim 16 wherein the drive power supply includes a current transformer for electrically insulating the drive power supply, the current transformer including:
a primary winding, having at least one turn, coupled to an alternating-current power source;
secondary windings coupled to the drive power supply; and
an electrical insulation between the primary and secondary windings for tolerating high voltage applied to the modulator by the main power source.

18. The modulator of claim 16 wherein the drive derives power from the power switching device whether the power switching device is in the on or off position.

19. The modulator of claim 1 wherein each of the plurality of voltage limiting means blocks one of a plurality of voltage values.

20. A voltage limiting means, comprising:
a parallel network including
a dissipating resistor,
a switch connected in series with the dissipating resistor;

a capacitor connected in parallel with the series connection of the dissipating resistor and the switch, and an auxiliary power supply connected in parallel with the capacitor of the parallel network for maintaining a charge on the capacitor, a polarity of the auxiliary power supply being dependent on a polarity of current passing to a load; and means for discharge protection connected in series with the parallel network, wherein the voltage limiting means has a blocking voltage associated therewith such that above the blocking voltage, current is allowed to conduct through the voltage limiting means and a voltage potential drop across the voltage limiting means is substantially independent of the current conducted therethrough, and below the blocking voltage, current is substantially prevented from passing through the voltage limiting means.

21. The voltage limiting means of claim 20 wherein the discharge protection means comprises a diode.

22. The modulator of claim 2 wherein each of the controllable switches comprises:
a power switching device;
a drive coupled to the power switching device for driving the power switching device;
a drive power supply coupled to the drive for providing voltage and current to the drive; and
a control input coupled to the drive for receiving input from a controller.

23. The modulator of claim 22 wherein the drive power supply includes a current transformer for electrically insulating the drive power supply, the current transformer including:
a primary winding, having at least one turn, coupled to an alternating-current power source;
secondary windings coupled to the drive power supply; and
an electrical insulation between the primary and secondary windings for tolerating high voltage applied to the modulator by the main power source.

24. The modulator of claim 22 wherein the drive derives power from the power switching device whether the power switching device is in the on or off position.

25. A high-power modulator, comprising:
a plurality of means for limiting voltage wherein at least one of the plurality of voltage limiting means comprises:
a parallel network including
a dissipating resistor,
a switch connected in series with the dissipating resistor,
a capacitor connected in parallel with the series connection of the dissipating resistor and the switch, and
an auxiliary power supply connected in parallel with the capacitor of the parallel network for maintaining a charge on the capacitor, a polarity of the auxiliary power supply being dependent on a polarity of current passing to the load; and
means for discharge protection connected in series with the parallel network; and
a plurality of controllable switches, each of the switches connected in parallel with a different one of the voltage limiting means to form a plurality of parallel pairs, each of the parallel pairs connected to each other in a series combination with a first parallel pair in the series combination being connectable to a main power source and a last parallel pair in the series combination being connectable to a load;

each of the switches being switchable from an off or open position to an on or closed position such that, for each of the parallel pairs:
with the switch in the off position,
when voltage applied to the voltage limiting means is above a first predetermined voltage, current is allowed to conduct through the voltage limiting means and a voltage potential drop across the voltage limiting means is substantially independent of the current conducted therethrough, and
when voltage applied to the voltage limiting means is below the first predetermined voltage, current is substantially prevented from passing through the voltage limiting means; and
with the switch in the on position, current is substantially all conducted through the switch and the voltage potential drop across the voltage limiting means is substantially zero;
the series combination having a voltage potential drop thereacross which is varied by operation of the controllable switches wherein:
a ratio of switches in the on position to those in the off position determines the voltage potential drop across the series combination and thus the voltage applied to the load by the main power source,
with each of the switches in the on position, the voltage potential drop across the series combination is substantially zero and substantially all of the voltage of the main power source is applied to the load, and
with each of the switches in the off position, the voltage potential drop across the series combination is greater than the voltage applied by the main power source and substantially no current is conducted to the load.

26. The modulator of claim 2 wherein at least one of the plurality of first voltage limiting means comprises at least one metal-oxide varistor.

27. The modulator of claim 2 wherein at least one of the plurality of second voltage limiting means comprises at least one metal-oxide varistor.

28. The modulator of claim 2 wherein at least one of the plurality of first voltage limiting means comprises a plurality of series networks connected in parallel, each of the series networks including at least one metal-oxide varistor connected in series to at least one balancing means.

29. The modulator of claim 2 wherein at least one of the plurality of second voltage limiting means comprises a plurality of series networks connected in parallel, each of the series networks including at least one metal-oxide varistor connected in series to at least one balancing means.

30. A high-power modulator, comprising:
a plurality of first means for limiting voltage connected to each other in series, the series connection of the plurality of first voltage limiting means being connectable in parallel to a load, wherein at least one of the plurality of first voltage limiting means comprises:
a parallel network including
a dissipating resistor,
a switch connected in series with the dissipating resistor,
a capacitor connected in parallel with the series connection of the dissipating resistor and the switch, and
an auxiliary power supply connected in parallel with the capacitor of the parallel network for maintaining a charge on the capacitor, a polarity of the auxiliary power supply dependent on a polarity of current passing to the load; and
means for discharge protection connected in series with the parallel network;
a plurality of second means for limiting voltage connected to each other in series, the series connection of the plurality of second voltage limiting means being connected in series between a main power source and the parallel connection of the plurality of first voltage limiting means and the load when the plurality of first voltage limiting means are connected in parallel to the load and when the main power source is coupled to the plurality of second voltage limiting means;
at least one controllable switch connected in parallel with at least one of the first or second voltage limiting means;
each of the switches being switchable from an off or open position to an on or closed position such that, for each of the parallel-connected switch and first or second voltage limiting means:
with the switch in the off position, current is allowed to conduct through the voltage limiting means and a voltage potential drop across the voltage limiting means is substantially independent of the current conducted therethrough, and
with the switch in the on position, current is substantially all conducted through the switch and the voltage potential drop across the voltage limiting means is substantially zero;
whereby, when voltage is applied by the main power source, a ratio of switches in the on position to those in the off position determines the voltage applied to the load.

31. A high-power modulator, comprising:
a plurality of first means for limiting voltage connected to each other in series, the series connection of the plurality of first voltage limiting means being connectable in parallel to a load;
a plurality of second means for limiting voltage connected to each other in series, the series connection of the plurality of second voltage limiting means being connected in series between a main power source and the parallel connection of the plurality of first voltage limiting means and the load when the plurality of first voltage limiting means are connected in parallel to the load and when the main power source is coupled to the plurality of second voltage limiting means, wherein at least one of the plurality of second voltage limiting means comprises:
a parallel network including
a dissipating resistor,
a switch connected in series with the dissipating resistor,
a capacitor connected in parallel with the series connection of the dissipating resistor and the switch, and
an auxiliary power supply connected in parallel with the capacitor of the parallel network for maintaining a charge on the capacitor, a polarity of the auxiliary power supply dependent on a polarity of current passing to the load; and
means for discharge protection connected in series with the parallel network;
at least one controllable switch connected in parallel with at least one of the first or second voltage limiting means;
each of the switches being switchable from an off or open position to an on or closed position such that, for each of the parallel-connected switch and first or second voltage limiting means:
with the switch in the off position, current is allowed to conduct through the voltage limiting means and a voltage potential drop across the voltage limiting means is substantially independent of the current conducted therethrough, and
with the switch in the on position, current is substantially all conducted through the switch and the voltage potential drop across the voltage limiting means is substantially zero;
whereby, when voltage is applied by the main power source, a ratio of switches in the on position to those in the off position determines the voltage applied to the load.

32. The modulator of claim 2 wherein at least one of the plurality of second voltage limiting means comprises:
regulation means; and
voltage reference means connected in series to the regulation means to maintain the voltage across the regulation means substantially constant and proportional to a reference voltage regardless of current flowing through the series combination of the regulation means and the voltage reference means.

33. The modulator of claim 32 wherein the regulation means comprises a transistor.

34. The modulator of claim 2 wherein each of the plurality of first voltage limiting means blocks one of a plurality of first voltage values and each of the plurality of second voltage limiting means blocks one of a plurality of second voltage values.

35. A voltage limiting means, comprising:
a parallel network including
a dissipating resistor,
a switch connected in series with the dissipating resistor,
a capacitor connected in parallel with the series connection of the dissipating resistor and the switch, and
an auxiliary power supply connected in parallel with the capacitor of the parallel network for maintaining a charge on the capacitor, a polarity of the auxiliary power supply being dependent on a polarity of current passing to a load; and
means for discharge protection connected in series with the parallel network,
wherein the voltage limiting means has a blocking voltage associated therewith such that
above the blocking voltage, current is allowed to conduct through the voltage limiting means and a voltage potential drop across the voltage limiting means is substantially independent of the current conducted therethrough, and below the blocking voltage, current is substantially prevented from passing through the voltage limiting means.

36. The modulator of claim 2 wherein at least one of the plurality of second voltage limiting means comprises:

a parallel network including
  a dissipating resistor,
  a switch connected in series with the dissipating resistor, and
  a capacitor connected in parallel with the series connection of the dissipating resistor and the switch; and means for discharge protection connected in series with the parallel network.

37. The modulator of claim 36 wherein the discharge protection means comprises a diode.

* * * * *